US012512828B2

(12) United States Patent
Yamato

(10) Patent No.: US 12,512,828 B2
(45) Date of Patent: Dec. 30, 2025

(54) LOAD DRIVING DEVICE, ELECTRONIC APPARATUS AND VEHICLE

(71) Applicant: ROHM CO., LTD., Kyoto (JP)

(72) Inventor: Tetsuo Yamato, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 196 days.

(21) Appl. No.: 18/393,494

(22) Filed: Dec. 21, 2023

(65) Prior Publication Data
US 2024/0213977 A1 Jun. 27, 2024

(30) Foreign Application Priority Data

Dec. 27, 2022 (JP) ................ 2022-209857

(51) Int. Cl.
H03K 17/0812 (2006.01)
B60R 16/02 (2006.01)
H03K 17/18 (2006.01)

(52) U.S. Cl.
CPC ....... *H03K 17/08122* (2013.01); *H03K 17/18* (2013.01); *B60R 16/02* (2013.01); *H03K 2217/0027* (2013.01); *H03K 2217/0072* (2013.01)

(58) Field of Classification Search
CPC . B60R 16/02; H02M 1/088; H03K 17/08122; H03K 17/18; H03K 2017/0027; H03K 2017/0072
USPC ...................................................... 361/93.7
See application file for complete search history.

(56) References Cited

U.S. PATENT DOCUMENTS

| 8,785,931 | B2* | 7/2014 | Kinouchi | H10D 30/635 257/77 |
| 2002/0140447 | A1* | 10/2002 | Throngnumchai | G01K 7/42 374/E7.042 |
| 2007/0103006 | A1* | 5/2007 | Zushi | H03K 17/687 307/130 |
| 2015/0098255 | A1* | 4/2015 | Nate | H02M 3/33523 363/21.16 |

(Continued)

FOREIGN PATENT DOCUMENTS

JP 2000194431 A * 7/2000
JP 2021-072740 5/2021

OTHER PUBLICATIONS

Machine translation of Yokomizo et al. Japanese Patent Document JP 2000-194431 Jul. 2000 (Year: 2000).*

*Primary Examiner* — Kevin J Comber
(74) *Attorney, Agent, or Firm* — Fish & Richardson P.C.

(57) ABSTRACT

The present disclosure provides a load driving device. The load driving device includes a load, a resistor configured to be connected in parallel to the load, and a switch device. The switch device includes an output terminal, a ground terminal, a first switch element and an abnormality detection circuit. The output terminal is configured to connect the load and the resistor. The ground terminal is configured to connect to a ground potential. The first switch element is configured to be connected between the output terminal and the ground terminal. The abnormality detection circuit is configured to distinguish between a load open at the output terminal and a ground fault at the output terminal based on a magnitude relationship between an output current flowing through the first switch element, a first threshold value and a second threshold value greater than the first threshold value.

8 Claims, 9 Drawing Sheets

(56) References Cited

U.S. PATENT DOCUMENTS

2021/0143810 A1* 5/2021 Takuma ............. H03K 17/0822
2022/0049669 A1* 2/2022 Arafune ............... G01R 31/006

* cited by examiner

LOAD DRIVING DEVICE, ELECTRONIC APPARATUS AND VEHICLE

TECHNICAL FIELD

The present disclosure relates to a load driving device, an electronic apparatus and a vehicle.

BACKGROUND

In recent years, intelligent power devices (IPDs) are developed in seek of meeting function safety based on such as the IOS26262 standard. Thus, a design for high reliability becomes even more critical for an IPD, and more particularly, abnormality detection for an output terminal of an IPD is especially important.

PRIOR ART DOCUMENT

Patent Publication

[Patent document 1] Japan Patent Publication No. 2021-72740

DETAILED DESCRIPTION OF THE EMBODIMENTS

In the present disclosure, a metal oxide semiconductor field effect transistor (MOSFET) refers to a transistor in which a gate has at least three layers including "a layer containing a conductor or a semiconductor such as polysilicon with a small resistance value", "an insulating layer", and "a layer including a P-type, N-type or intrinsic semiconductor layer". That is to say, the gate structure of the MOSFET is not limited to the structure of the three layers including metal, oxide and semiconductor.

In the present disclosure, a reference voltage refers to a stable voltage in an ideal state, and is in practice a voltage slightly variable in response to temperature changes.

<Electronic Apparatus>

Figure 1:
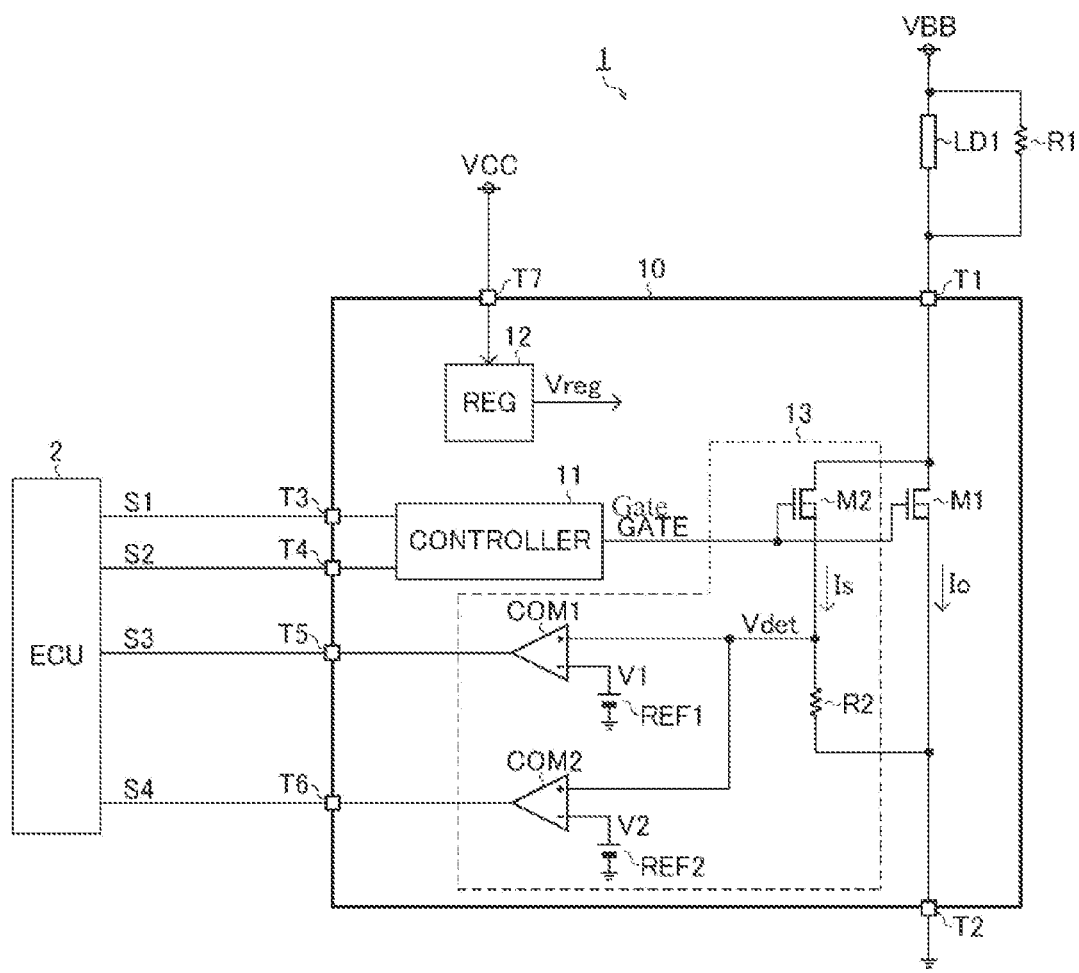
FIG. 1 is a diagram of a configuration example of a load driving device.

FIG. 1 shows a diagram of a configuration example of a load driving device 1. The load driving device 1 of the configuration example includes a semiconductor integrated circuit device 10, a load LD and a resistor R1.

The semiconductor integrated circuit device 10 is a switch device disposed on a low potential side (a so-called low-side switch LSI) compared to the load LD1.

The semiconductor integrated circuit device 10 includes an output terminal T1, a ground terminal T2, a standby terminal T3, an input terminal T4, external output terminals T5 and T6, and a power terminal T7.

The output terminal T1 is connected to a first end of the load LD1 and a first end of the resistor R1. A power supply voltage VBB is supplied to a second end of the load LD1 and a second end of the resistor R1. That is to say, the resistor R1 is a pull-up resistor connected in parallel to the load LD1. A resistance value of the resistor R1 is greater than a resistance value of the load DL1. The ground terminal T2 is connected to a ground potential. The standby terminal T3, the input terminal T4, the external output terminals T5 and T6 and the power terminal T7 are connected to an electronic control unit (ECU) 2. The standby terminal T3 receives a standby signal S1 supplied from the ECU 2. The input terminal T4 receives an input signal S2 supplied from the ECU 2. The external output terminal T5 supplies an abnormality detection signal S3 to the ECU 2. The external output terminal T6 supplies an abnormality detection signal S4 to the ECU 2. A power supply voltage VCC is supplied to the power terminal T7.

The semiconductor integrated circuit device 10 further includes a control circuit 11, an internal power supply unit 12, an abnormality detection circuit 13 and a switch element M1.

When the standby signal S1 is at a high level (HIGH), the control circuit 11 sets the semiconductor integrated circuit device 10 to an active state. Moreover, when the standby signal S1 is at a low level (LOW), the control circuit 11 sets the semiconductor integrated circuit device 10 to a standby state (a non-active state). Thus, the abnormality detection circuit 13 becomes an active state (an operation state) when the standby signal S1 is at a high level, and becomes a standby state (a non-active state) when the standby signal S1 is at a low level.

The control circuit 11 sets a gate driving signal GATE to a high level when the standby signal S1 is at a high level and the input signal S2 is at a high level, and turns on the switch element M1 which is an N-channel MOSFET. Moreover, the control circuit 11 sets the gate driving signal GATE to a low level when the standby signal S1 is at a high level and the input signal S2 is at a low level, and turns off the switch element M1 which is an N-channel MOSFET. The gate driving signal GATE is supplied to a gate of the switch element M1. A drain of the switch element M1 is connected to the output terminal T1. A source of the switch element M1 is connected to the ground terminal T2.

The internal power supply unit 12 generates a predetermined internal power supply voltage Vreg from the power supply voltage VBB, and supplies the predetermined internal power supply voltage Vreg to each component of the semiconductor integrated circuit device 10.

The abnormality detection circuit 13 distinguishes, based on a magnitude relationship between an output current flowing through the first switch element M1, a first threshold value and a second threshold value greater than the first threshold value, between a load open at the output terminal T1 and a ground fault at the output terminal T1.

The abnormality detection circuit 13 of this configuration example includes a switch element M2, a resistor R2, comparators COM1 and COM2, and reference voltage sources REF1 and REF2.

A drain of the switch element M2, which is an N-channel MOSFET, is connected to the drain of the switch element M1 and the output terminal T1. The gate driving signal GATE is supplied to a gate of the switch element M2. A source of the switch element M2 is connected to a first terminal of the resistor R2 which is a sensing resistor. A second end of the resistor R2 is connected to the source of the switch element M1 and the ground terminal T2.

The switch element M2 generates a sensing current Is corresponding to an output current Io flowing through the switch element M1. A magnitude ratio of the switch element M1 to the switch element M2 is m:1 (where m>1). Thus, the sensing current Is becomes a magnitude that reduces the output current Io to 1/m.

The resistor R2 is a current/voltage conversion element that generates, at a connection node between the switch element M2 and the resistor R2, a detected voltage Vdet corresponding to the sensing current Is. The detected voltage Vdet is supplied to a non-inverting input terminal of each of the comparators COM1 and COM2.

The reference voltage source REF1 supplies a reference voltage V1 corresponding to a first threshold to an inverting input terminal of the comparator COM1. The reference voltage source REF2 supplies a reference voltage V2 corresponding to a second threshold to an inverting input terminal of the comparator COM2. A value of the reference voltage V2 is greater than a value of the reference voltage V1.

The comparator COM1 supplies an abnormality detection signal S3, which is a comparison result of the detected voltage Vdet and the reference voltage V1, to the external output terminal T5. The comparator COM2 supplies an abnormality detection signal S4, which is a comparison result of the detected voltage Vdet and the reference voltage V2, to the external output terminal T6. The abnormality signals S3 and S4, which are the detection results of the abnormality detection circuit 13, are supplied to the ECU 2 via the external output terminals T5 and T6.

Figure 2:
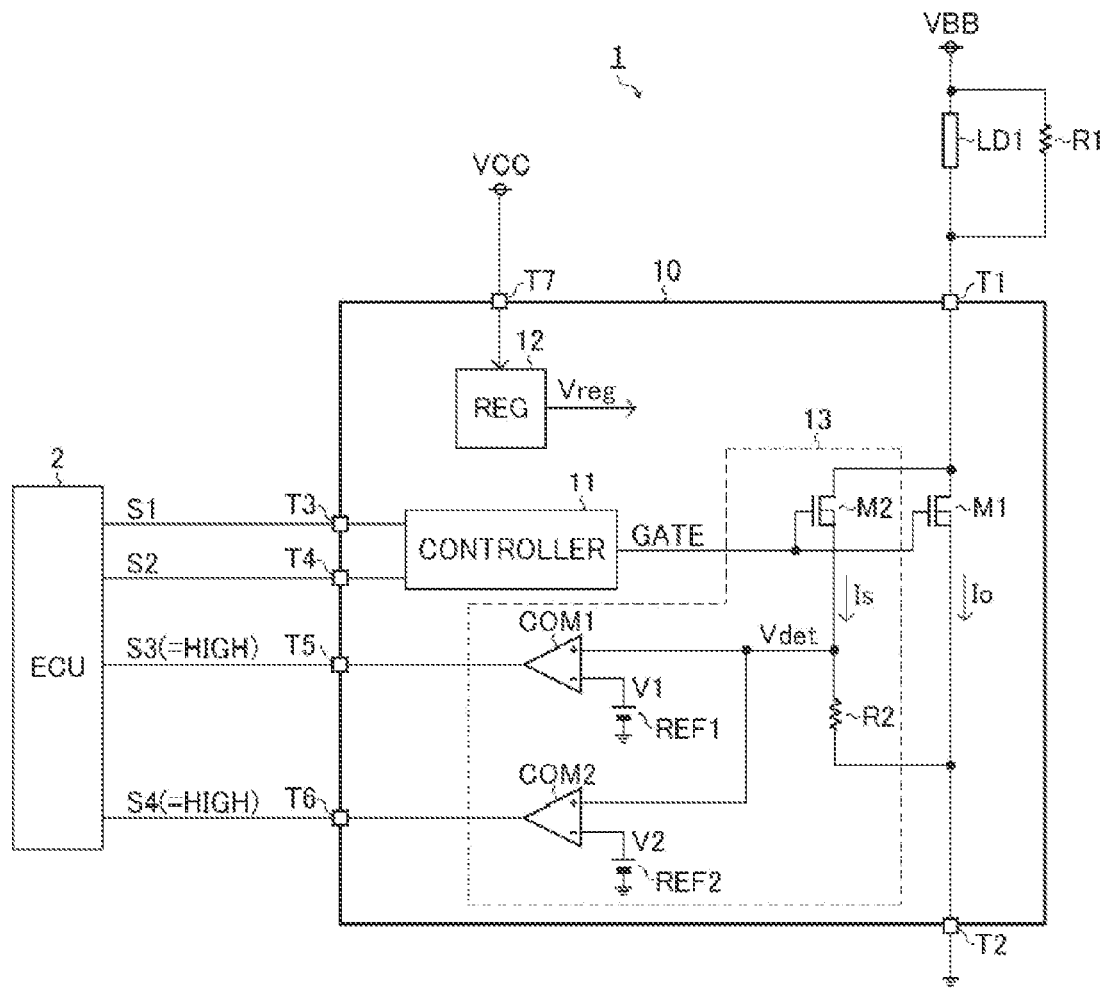
FIG. 2 is a diagram of the load driving device in normal conditions.

FIG. 2 shows a diagram of the load driving device 1 in normal conditions (when normal). In normal conditions, the load LD1 is connected to the output terminal T1, and so the output current Io in a greater value flows when the switch element M1 is on. As a result, in normal conditions, the detected voltage Vdet is greater than both of the reference voltage V1 and the reference voltage V2, and both of the abnormality detection signals S3 and S4 become high level.

Figure 3:
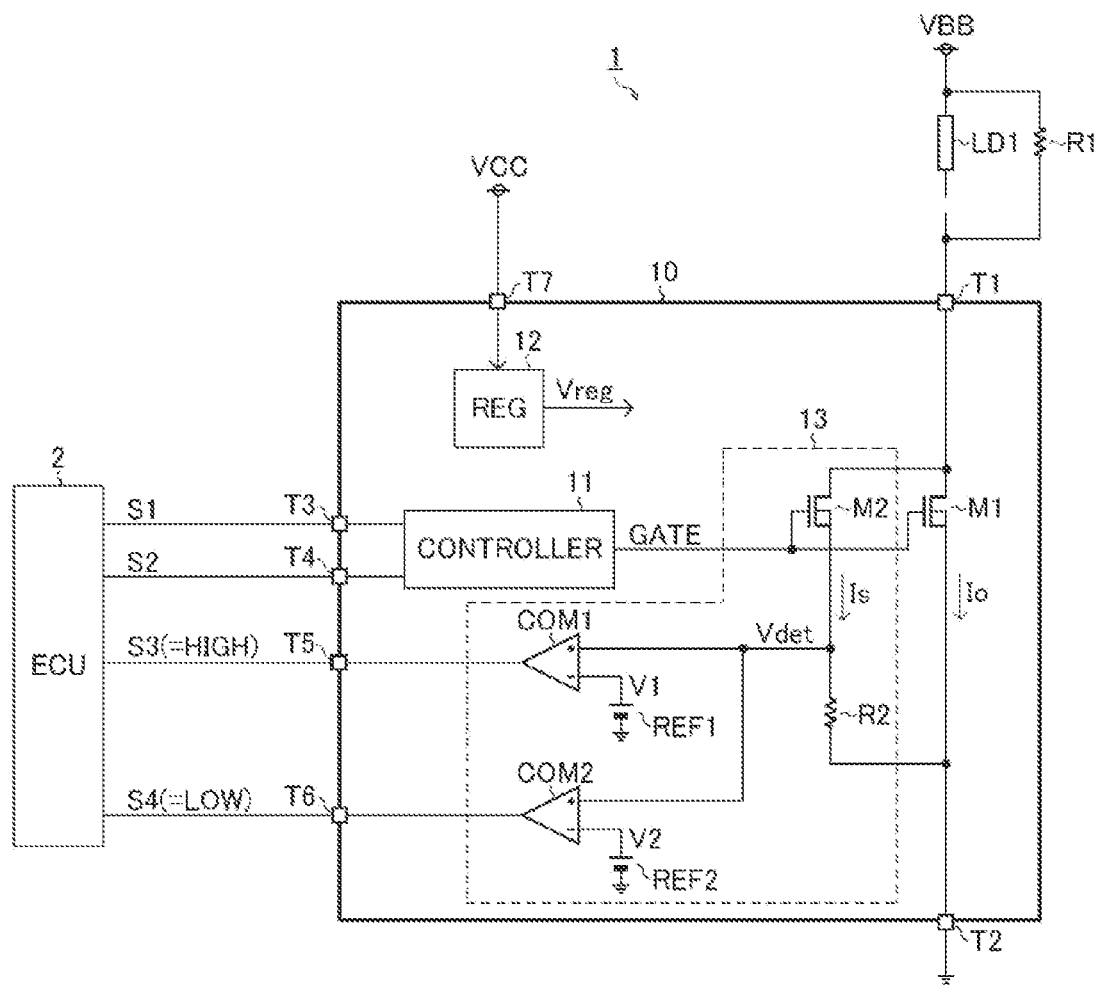
FIG. 3 is a diagram of the load driving device in the event of a load open.

FIG. 3 shows a diagram of the load driving device 1 in the event of a load open. In a load open, the load LD1 is not connected to the output terminal T1, but the resistor R1 with a larger resistance value is connected to the output terminal T. Thus, the output current Io in a smaller value flows when the switch element M1 is on. As a result, in a load open, the detected voltage Vdet is greater than the reference voltage V1 but less than the reference voltage V2, and the abnormality detection signal S3 becomes high level and the abnormality detection signal S4 becomes low level.

Figure 4:
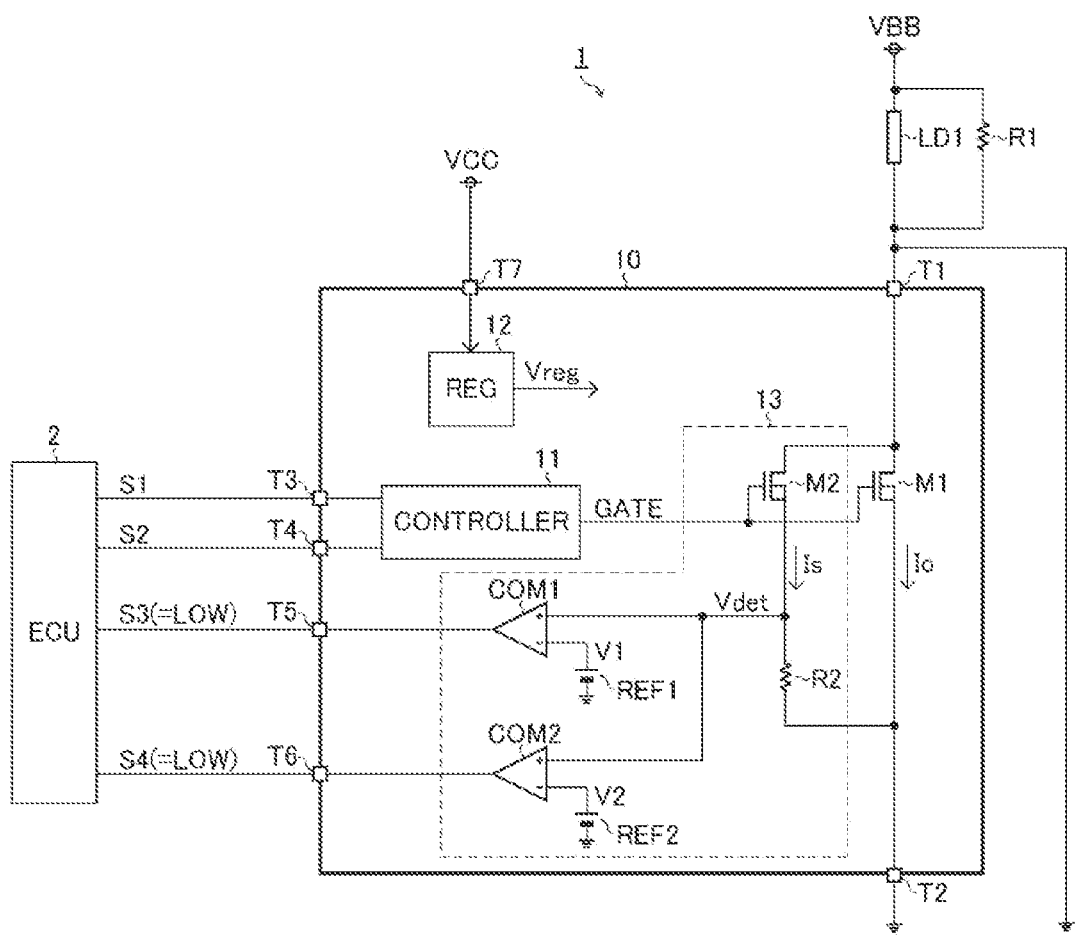
FIG. 4 is a diagram of the load driving device in the event a ground fault.

FIG. 4 shows a diagram of the load driving device 1 in the event a ground fault. In a ground fault, since the output terminal T1 is connected to a ground potential, the output current Io also changes to zero even when the switch element M1 is on. As a result, in a ground fault, the detected voltage Vdet is less than both of the reference voltage V1 and the reference voltage V2, and both of the abnormality detection signals S3 and S4 become low level.

As described above, the load driving device 1 is capable of distinguishing between a load open and a ground fault. Thus, for example, when the load driving device 1 is mounted in a vehicle, the load driving device 1 can react to functional safety requirements to enhance reliability.

Variation Examples

Figure 5:
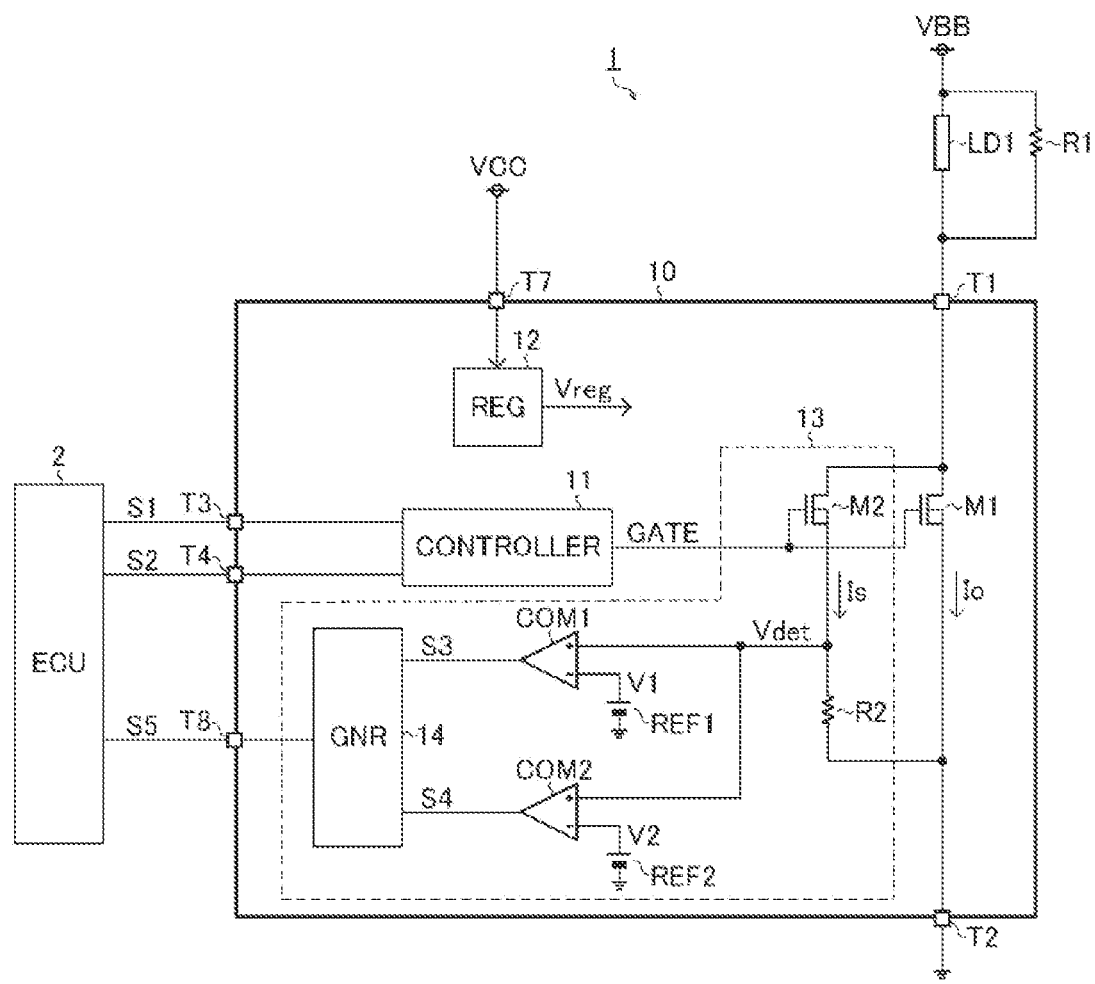
FIG. 5 is a diagram of a first variation example of the load driving device.

FIG. 5 shows a diagram of a first variation example of the load driving device. The load driving device 1 of the first variation example shown in FIG. 5 differs from the load driving device 1 shown in FIG. 1 in that, the abnormality detection circuit 13 includes a signal generation circuit 14, and the semiconductor integrated circuit device 10 includes an output terminal T8 in substitution for the external output terminals T5 and T6, while the rest are fundamentally the same as those of the load driving device 1 shown in FIG. 1.

The signal generation circuit 14 generates an abnormality detection signal S5 based on the abnormality detection signals S3 and S4. The abnormality detection signal S5 becomes a high-level signal when both of the abnormality detection signals S3 and S4 are at a high level, becomes a low-level signal when the abnormality detection signal S3 is at a high level and the abnormality detection signal S4 is at a low level, and becomes a pulse width modulation signal (PMW) signal when both of the abnormality detection signals S3 and S4 are at a low level. The abnormality signal S5, which is a detection result of the abnormality detection circuit 13, is supplied to the ECU 2 via the external output terminal T8. Compared to the load driving device 1 shown in FIG. 1, the load driving device 1 of the first variation example shown in FIG. 5 can reduce the number of terminals of the semiconductor integrated circuit device 10.

Figure 6:
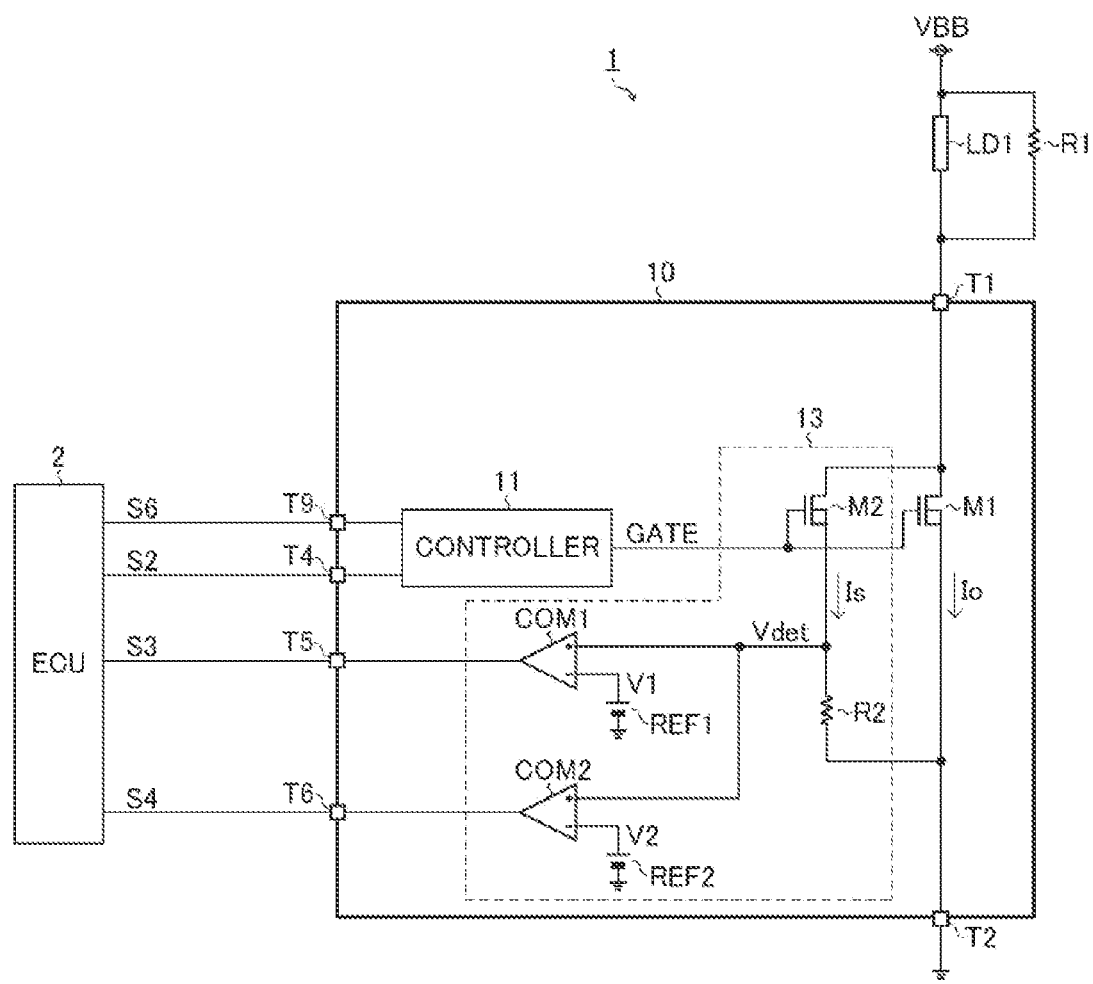
FIG. 6 is a diagram of a second variation example of the load driving device.

FIG. 6 shows a diagram of a load driving device of a second variation example. The load driving device 1 of the second variation example shown in FIG. 6 differs from the load driving device 1 shown in FIG. 1 in that, the semiconductor integrated circuit device 10 does not include the internal power supply unit 12 but includes an enable terminal T9 in substitution for the standby terminal T3, while the rest are fundamentally the same as those of the load driving device 1 shown in FIG. 1.

When the input signal S2 is at a high level, the control circuit 11 of this embodiment supplies the input signal S2 to each component of the semiconductor integrated circuit device 10. Thus, when the input signal S2 is at a high level, the semiconductor integrated circuit device 10 becomes an active state (a device in operation). The input signal S2 is used as an internal power supply voltage in the components of the semiconductor integrated circuit device 10. On the other hand, when the input signal S2 is at a low level, the semiconductor integrated circuit device 10 becomes a standby state (a non-active state).

The enable terminal T9 receives an enable signal S6 supplied from the ECU 2. The control circuit 11 sets the abnormality detection circuit 13 to an enabled state (an operation state) when the enable signal S6 is at a high level, and sets the abnormality detection circuit 13 to a disabled state (a non-active state) when the enable signal S1 is at a low level. Moreover, the enable terminal T9 can also be removed from the semiconductor integrated circuit device 10, and the abnormality detection circuit 13 is persistently in an active state (an operation state) when the semiconductor integrated circuit device 10 is in an active state (an operation state).

Figure 7:
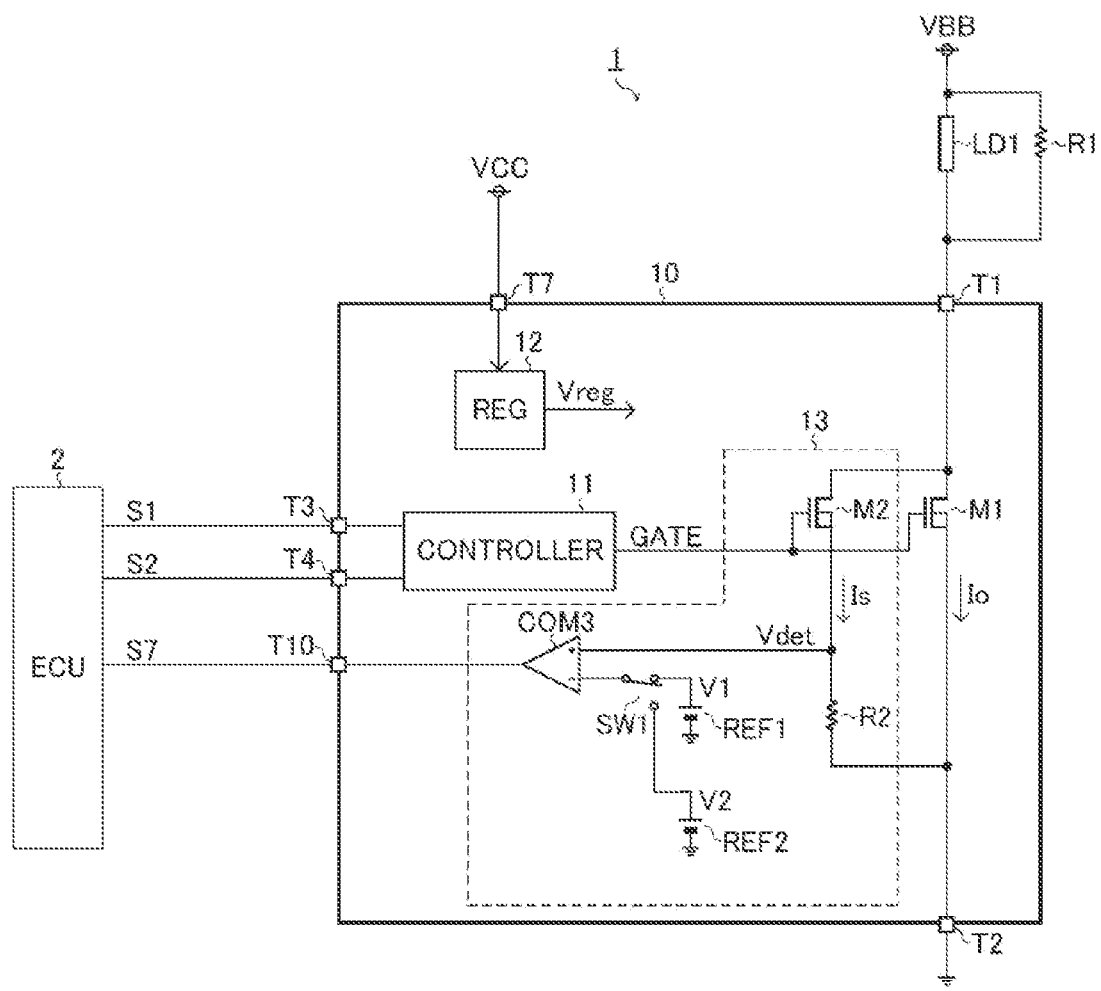
FIG. 7 is a diagram of a third variation example of the load driving device.

FIG. 7 shows a diagram of a third variation example of the load driving device. The load driving device 1 of the third variation example shown in FIG. 7 differs from the load driving device 1 shown in FIG. 1 in that, the abnormality detection circuit 13 includes a comparator COM3 and a switch SW1 in substitution for the comparators COM1 and COM2, while the rest are fundamentally the same as those of the load driving device 1 shown in FIG. 1.

The detected voltage Vdet is supplied to a non-inverting input terminal of the comparator COM3. The switch SW1 time-divisionally switches between the reference voltage V1 and the reference voltage V2, and supplies the switched reference voltage V1 or the switched reference voltage V2 to the non-inverting input terminal of the comparator COM3. Thus, the reference voltage supplied to the non-inverting input terminal of the comparator COM3 is time-divisionally switched between the reference voltage V1 and the reference voltage V2. The switch SW1 switches between the reference voltage V1 and the reference voltage V2 according to a fixed period, for example.

The comparator COM3 supplies an abnormality detection signal S7, which is a comparison result between the detected voltage Vdet and the reference voltage V1 or the reference voltage V2, to the external output terminal T10. The abnormality signal S7, which is a detection result of the abnormality detection circuit 13, is supplied to the ECU 2 via the external output terminal T10. The ECU 2 is capable of distinguishing, based on a length of a high-level interval of the abnormality detection signal S7 and a length of a low-level interval of the abnormality detection signal S7, in which of a normal state, a load open state and a ground fault state the load driving device 1 is.

Compared to the load driving device 1 shown in FIG. 1, the load driving device 1 of the third variation example shown in FIG. 7 can reduce the number of terminals of the semiconductor integrated circuit device 10.

Figure 8:
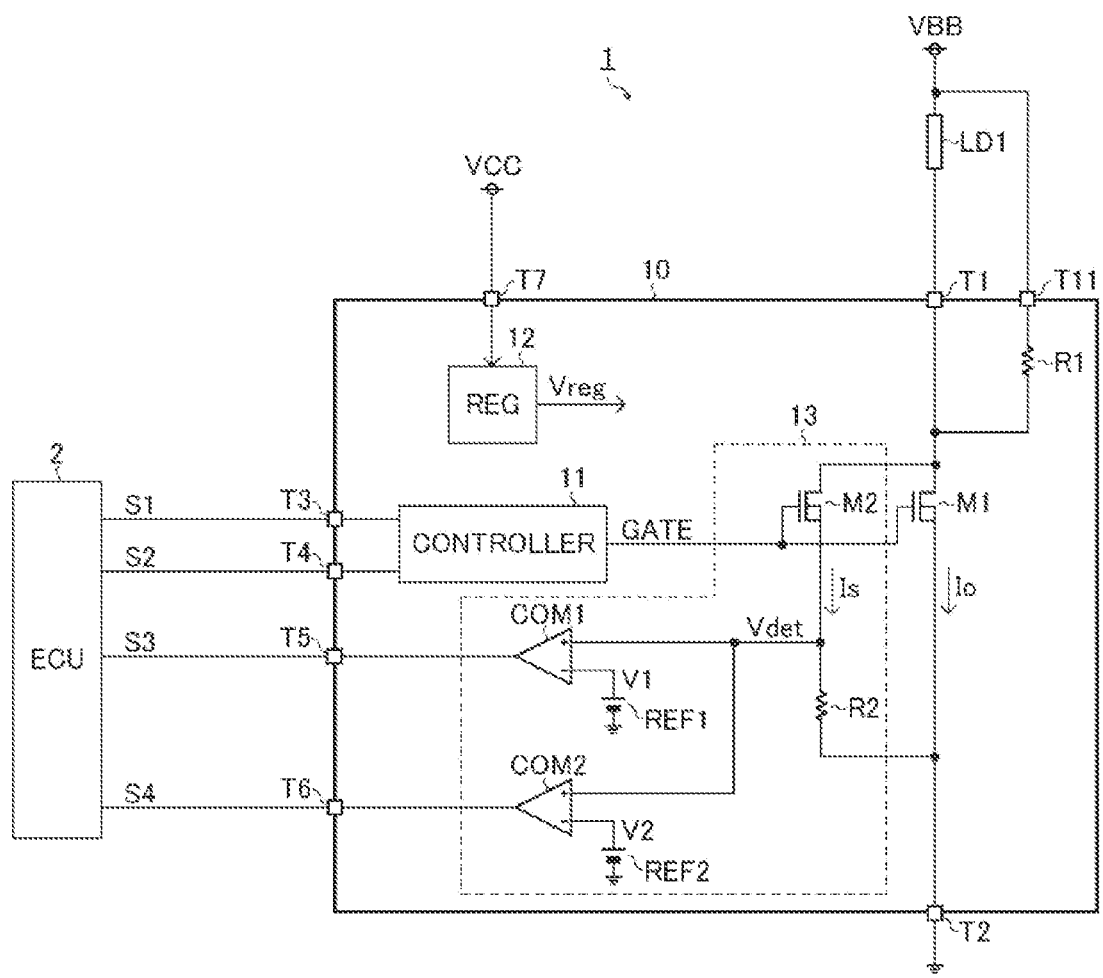
FIG. 8 is a diagram of a fourth variation example of the load driving device.

FIG. 8 shows a diagram of a fourth variation example of the load driving device. The load driving device 1 of the fourth variation example shown in FIG. 8 differs from the load driving device 1 shown in FIG. 1 in that, the semiconductor integrated circuit device 10 includes a resistor R1 and a power terminal T11, while the rest are fundamentally the same as those of the load driving device 1 shown in FIG. 1.

A power supply voltage VCC is supplied to the power terminal T11. A first end of the resistor R1 is connected to the power terminal T11. A second end of the resistor R1 is connected to the output terminal T1 and the drains of the switch elements M1 and M2.

Compared to the load driving device 1 shown in FIG. 1, the load driving device 1 of the fourth variation example shown in FIG. 8 can reduce the number of external components connected to the semiconductor integrated circuit device 10.

<Application in Vehicle>

Figure 9:
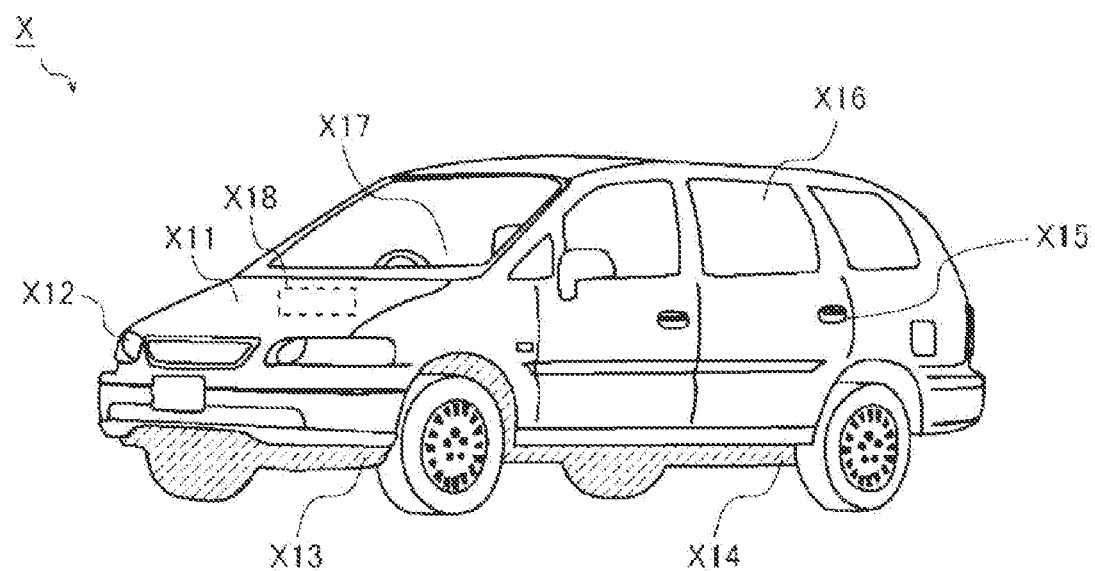
FIG. 9 is an appearance diagram of a configuration example of a vehicle.

FIG. 9 shows an appearance diagram of a configuration example of a vehicle. The vehicle X of this configuration example is mounted with a battery (not shown), and various electronic apparatus X11 to X18 that are operated by electrical power received from the battery. Moreover, for illustration purposes, the positions for mounting these electronic apparatuses X11 to X18 in the drawing may be different in practice.

The vehicle device X11 is an engine control unit that performs engine-related control (fuel injection control, electronic throttle control, idle speed control, oxygen sensor heater control, and automatic cruise control).

The vehicle device X12 is a lamp control unit that performs dimming and lighting control of a high intensity discharged lamp (HID) or a daytime running lamp (DRL).

The vehicle device X13 is a transmission device control unit that performs transmission device-related control.

The vehicle device X14 is a vehicle body control unit that performs motion-related control of the vehicle X such as anti-lock brake system (ABS) control, electric power steering control (EPS) and electronic suspension control.

The vehicle device X15 is a safety control unit that performs driving control such as door lock and anti-theft alarm.

The vehicle device 16X is, for example, an electronic apparatus including a wiper, power rear-view mirror, power window, shock absorber, power sunroof and power seat, which is assembled on the vehicle X at the factory stage as standard accessories or manufacturer optional accessories.

The vehicle device X17 is, for example, an electronic apparatus including a vehicle audiovisual (AV) device, car navigation system and electronic toll collection (ETC) system, which can be mounted on vehicle X as a user option as desired.

The electronic apparatus X18 is, for example, an electronic apparatus including a vehicle-mounted blower, oil pump, water pump, battery cooling fan, which is equipped with a high-voltage system motor.

In addition, the load driving device 1 and the ECU 2 given in the description above can be assembled on any one of the electronic apparatuses X11 to X18. Moreover, a destination for mounting the load driving device 1 given in the description above is not limited to being a vehicle, and can be, for example, an industrial machine or a civilian machine.

Other

Various modifications may be made to the embodiments of the present disclosure within the scope of the technical concept of the claims. The various embodiments and the variation examples given so far in the description may be appropriately implemented in combination given that no contradictions are incurred. The embodiments above are only examples of possible implementations of the present disclosure, and the meanings of the terms of the present disclosure or the constituents are not limited to the description of the embodiments above.

Notes

A note is attached to the disclosure to show specific configuration examples of the embodiments above.

A load driving device (1) of the present disclosure is configured as follows (a first configuration), comprising:
 a load (LD1);
 a resistor (R1), configured to be connected in parallel to the load; and
 a switch device (10), wherein the switch device includes:
  an output terminal (T1), configured to connect to the load and the resistor;
  a ground terminal (T2), configured to connect to a ground potential;
  a first switch element (M1), configured to be connected between the output terminal and the ground terminal; and
  an abnormality detection circuit (13), configured to distinguish between a load open at the output terminal and a ground fault at the output terminal based on a magnitude relationship between an output current flowing through the first switch element, a first threshold value and a second threshold value greater than the first threshold value.

The load driving device of the first configuration can also be configured as follows (a second configuration), wherein the abnormality detection circuit includes:
- a second switch element (M2), configured to connect to the output terminal; and
- a sensing resistor (R2), configured to be connected between the second switch element and the ground terminal.

The load driving device of the second configuration can also be configured as follows (a third configuration), wherein the abnormality detection circuit includes:
- a first comparator (COM1), configured to compare a detected voltage generated at a connection node between the second switch element and the sensing resistor with a first reference voltage corresponding to the first threshold value; and
- a second comparator (COM2), configured to compare the detected voltage with a second reference voltage corresponding to the second threshold value.

The load driving device of the second configuration can also be configured as follows (a fourth configuration), wherein the abnormality detection circuit includes a comparator (COM3) configured to compare a detected voltage generated at a connection node between the second switch element and the sensing resistor with a reference voltage, and the reference voltage is time-divisionally switched between a first reference voltage corresponding to the first threshold value and a second reference voltage corresponding to the second threshold value.

The load driving device of any one of the first to fourth configurations can also be configured as follows (a fifth configuration), wherein the switch device includes a control terminal (T3, T9) and is configured to switch the abnormality detection circuit between operation and non-operation based on a voltage applied to the control terminal.

The load driving device of any one of the first to fifth configurations can also be configured as follows (a sixth configuration), wherein the switch device includes an external output terminal (T5, T6, T8, T10) for outputting a detection result of the abnormality detection circuit to outside of the switch device.

An electronic apparatus (X11 to X18) of the present disclosure is configured to include the load driving device of the sixth configuration above (a seventh configuration).

A vehicle (X) of the present disclosure is configured to include the electronic apparatus of the seventh configuration (an eighth configuration).

The invention claimed is:

1. A load driving device, comprising:
a load;
a resistor, configured to be connected in parallel to the load; and
a switch device, wherein the switch device includes:
   an output terminal, configured to connect to the load and the resistor;
   a ground terminal, configured to connect to a ground potential;
   a first switch element, configured to be connected between the output terminal and the ground terminal; and
   an abnormality detection circuit, configured to distinguish between a load open at the output terminal and a ground fault at the output terminal based on a magnitude relationship between an output current flowing through the first switch element, a first threshold value and a second threshold value greater than the first threshold value.

2. The load driving device of claim 1, wherein the abnormality detection circuit includes:
a second switch element, configured to connect to the output terminal; and
a sensing resistor, configured to be connected between the second switch element and the ground terminal.

3. The load driving device of claim 2, wherein the abnormality detection circuit includes:
a first comparator, configured to compare a detected voltage generated at a connection node between the second switch element and the sensing resistor with a first reference voltage corresponding to the first threshold value; and
a second comparator, configured to compare the detected voltage with a second reference voltage corresponding to the second threshold value.

4. The load driving device of claim 2, wherein
the abnormality detection circuit includes a comparator configured to compare a detected voltage generated at a connection node between the second switch element and the sensing resistor with a reference voltage, and
the reference voltage is time-divisionally switched between a first reference voltage corresponding to the first threshold value and a second reference voltage corresponding to the second threshold value.

5. The load driving device of claim 1, wherein the switch device includes a control terminal and is configured to switch the abnormality detection circuit between operation and non-operation based on a voltage applied to the control terminal.

6. The load driving device of claim 1, wherein the switch device includes an external output terminal for outputting a detection result of the abnormality detection circuit to outside of the switch device.

7. An electronic apparatus, comprising the load driving device of claim 1.

8. A vehicle, comprising the electronic apparatus of claim 7.

* * * * *